United States Patent [19]

Abe et al.

[11] Patent Number: 5,292,694
[45] Date of Patent: Mar. 8, 1994

[54] METHOD OF PRODUCING LOW TEMPERATURE FIRING DIELECTRIC CERAMIC COMPOSITION CONTAINING $B_2O_3$

[75] Inventors: Masahiro Abe; Tsutomu Nanataki; Shinsuke Yano, all of Nagoya, Japan

[73] Assignee: NGK Insulators, Ltd., Japan

[21] Appl. No.: 950,664

[22] Filed: Sep. 25, 1992

[30] Foreign Application Priority Data

Sep. 27, 1991 [JP] Japan ................... 3-276587
Mar. 18, 1992 [JP] Japan ................... 4-92180
Sep. 21, 1992 [JP] Japan ................... 4-276597

[51] Int. Cl.$^5$ .............................. C04B 35/46
[52] U.S. Cl. ................... 501/139; 501/32; 501/138
[58] Field of Search ............... 501/32, 138, 139

[56] References Cited

U.S. PATENT DOCUMENTS

| | | | |
|---|---|---|---|
| 3,775,142 | 11/1973 | Roup | 501/134 |
| 3,811,937 | 5/1974 | Maher | 501/74 |
| 4,222,783 | 9/1980 | Atsumi et al. | 501/138 |
| 4,283,753 | 8/1981 | Burn | 501/137 |
| 4,610,971 | 9/1986 | Wada et al. | 501/137 |
| 4,861,736 | 8/1989 | Ono et al. | 501/138 |
| 5,073,523 | 12/1991 | Yamada et al. | 501/32 |
| 5,117,326 | 5/1992 | Sano et al. | 264/61 |

FOREIGN PATENT DOCUMENTS

| | | |
|---|---|---|
| 0256405 | 2/1988 | European Pat. Off. . |
| 0275053 | 7/1988 | European Pat. Off. . |
| 0385363 | 9/1990 | European Pat. Off. . |
| 4010827 | 10/1990 | Fed. Rep. of Germany . |
| 4028279 | 3/1991 | Fed. Rep. of Germany . |
| 59-214105 | 12/1984 | Japan . |
| 60-18086 | 5/1985 | Japan . |
| 61-261263 | 11/1986 | Japan . |
| 62-216107 | 9/1987 | Japan . |
| 1-275466 | 11/1989 | Japan . |
| 2-44609 | 2/1990 | Japan . |
| 3-290358 | 12/1991 | Japan . |
| 3-295855 | 12/1991 | Japan . |
| 3-295856 | 12/1991 | Japan . |
| 4-16884 | 3/1992 | Japan . |
| 692810 | 10/1979 | U.S.S.R. . |

OTHER PUBLICATIONS

Database WPIL Week 9006, Derwent Publications Ltd., London, GB; AN 90–037430 & DD-A-271 235 (VEB Elektronik Gera) Aug. 30, 1989.

Primary Examiner—Mark L. Bell
Assistant Examiner—Deborah Jones
Attorney, Agent, or Firm—Parkhurst, Wendel & Rossi

[57] ABSTRACT

A method of producing a dielectric ceramic composition is disclosed which includes the steps of: preparing a main ceramic composition comprising BaO, TiO, and $RE_2O_3$ (where RE represents at least one rare earth metal) as major components; calcining a mixture of starting materials which give the main ceramic composition, at a temperature of 1050° C. or higher, to provide a calcined mixture; finely pulverizing the calcined mixture to provide a calcined ceramic powder having an average grain size of not larger than 0.8 μm; and adding, as at least a part of a secondary component, a $B_2O_3$ powder or a glass powder containing $B_2O_3$, to the main ceramic composition. Also disclosed are a dielectric resonator and dielectric filter using such a dielectric ceramic composition as produced according to the above method, and a method of producing such a dielectric resonator or filter.

21 Claims, 1 Drawing Sheet

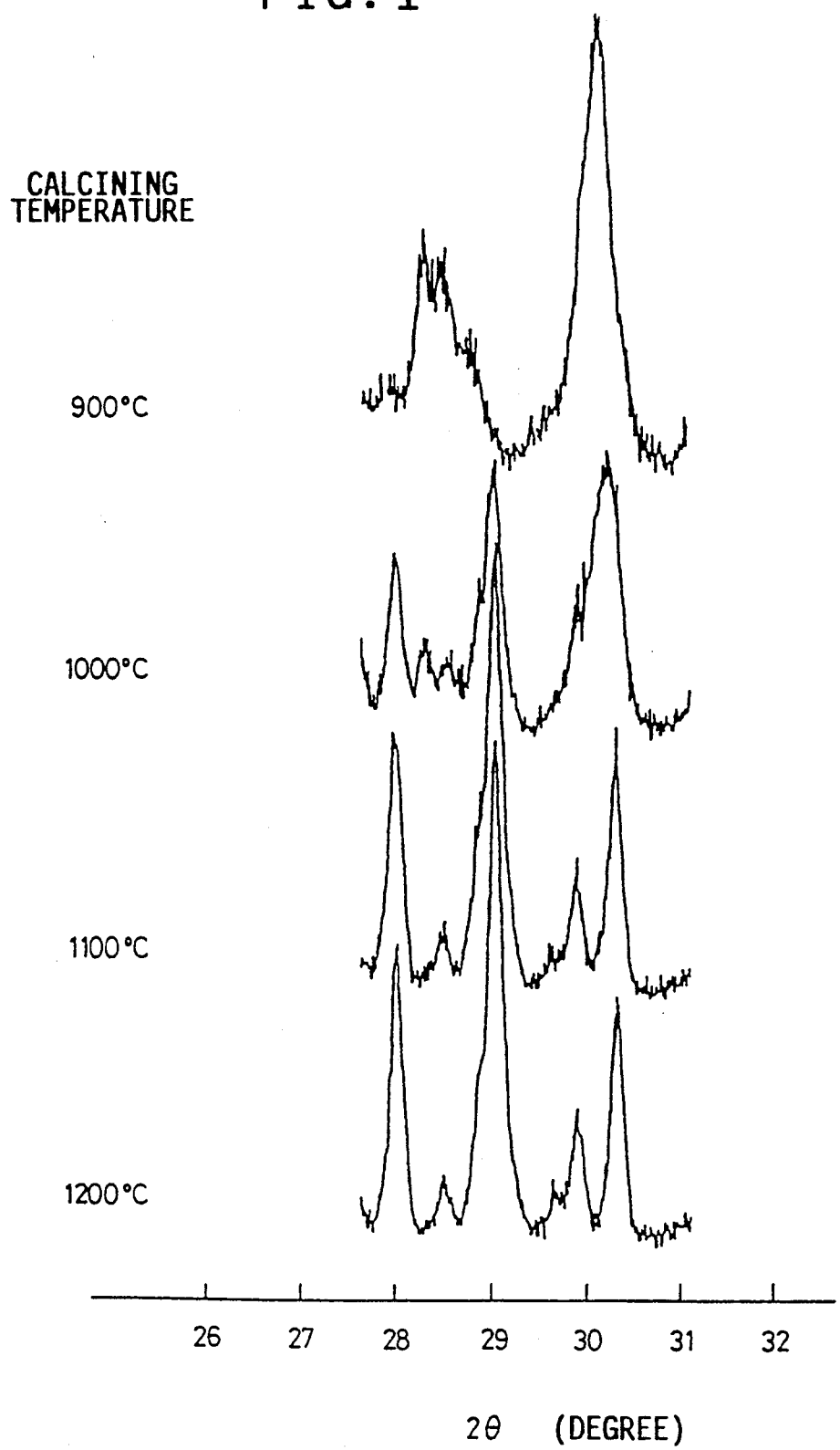

METHOD OF PRODUCING LOW TEMPERATURE FIRING DIELECTRIC CERAMIC COMPOSITION CONTAINING $B_2O_3$

BACKGROUND OF THE INVENTION

1. Field of the Invention

The present invention relates generally to a method of producing a dielectric ceramic composition which can be fired at a relatively low temperature, and more particularly to a method of producing such a low temperature firing dielectric ceramic composition for microwave applications, which is suitably used for a dielectric resonator having internal conductive layers, of a stripline type filter, for example. The present invention is also concerned with a dielectric resonator obtained by using such a dielectric ceramic composition, a dielectric filter including a plurality of such dielectric resonators, and with a method of producing the dielectric resonator or dielectric filter.

2. Discussion of the Prior Art

In a modern microwave telecommunication system such as a portable or automobile telephone system, there is widely used a coaxial type dielectric filter using a ceramic composition having a high dielectric constant. The coaxial type dielectric filter has a plurality of coaxial type resonators connected to each other. Each resonator is a cylindrical dielectric block which has inside and outside conductors formed on inner and outer circumferential surfaces of the block, respectively. This type of dielectric filter has a limitation in reducing the size and thickness thereof due to its construction. In view of this, there is proposed a stripline type filter of a tri-plate structure, which incorporates internal conductive layers or strips within a dielectric substrate. In this stripline type filter, a patterned array of conductors in the form of strips are integrally embedded in the dielectric substrate so as to provide a plurality of resonators. The thus constructed stripline type filter is comparatively compact and thin.

In fabricating such a stripline type dielectric filter having the internal conductive layers or strips as described above, a dielectric ceramic composition which gives the dielectric substrate must be co-fired with the internal conductive layers. Since known dielectric ceramic compositions have a considerably high firing temperature, there is a limit to conductive materials which can be used for the internal conductive layers, thus making it difficult to employ an Ag-containing material having a relatively low conductivity resistance. In microwave circuits incorporating conductors therein, especially in stripline type filter devices, Ag or Cu having low conductivity resistance needs to be used so as to reduce signal loss. Cu conductors must be fired in a non-oxidizing atmosphere, such as nitrogen, since Cu forms oxides when fired in an oxidizing atmosphere. However, the firing under the non-oxiding atmosphere makes it difficult to remove an organic binder which is added to an unfired ceramic body, and also causes problems such as relatively high processing cost. While Ag conductors may be fired in an oxiding atmosphere, Ag has a relatively low melting point of 962° C., and thereby requires the use of a dielectric ceramic composition for cofiring therewith, which can be fired at 962° C. or lower, desirably at 950° C. or lower, more desirably 900° C. or lower.

On the other hand, the dielectric ceramics used in the microwave applications need to have a high specific dielectric constant, which leads to reduction in the length of resonators used in the filter devices described above, making the devices small-sized. When the devices are used at a relatively low microwave frequency around 1GHZ, the length of the resonators tends to be increased due to a relatively long wavelength. In this case, the specific dielectric constant must be increased so as to shorten the length of the resonators. Further, the unloaded Q of the dielectric ceramics, which affects the characteristics of the devices, such as insertion loss of filters, must be kept at a high value in the microwave region. While the length of resonators tends to be reduced at higher frequencies, due to an accordingly short wavelength, the dielectric ceramics used desirably has a sufficiently large unloaded Q since the Q value tends to be reduced at higher frequencies. (f·Q=const. f=frequency).

Among various dielectric ceramic compositions which have been proposed, a dielectric ceramic composition which contains oxides of Ba, Ti, RE (rare earth metals) and Bi is known as having a high specific dielectric constant, a large unloaded Q, and a small temperature coefficient of the resonance frequency. Also are known dielectric ceramics having as a major crystal phase a solid solution in the $BaO-RE_2O_3-4TiO_2$ or $BaO-RE_2O_3-5TiO_2$ system. Although those dielectric ceramics are known as having a relatively high specific dielectric constant, they have a disadvantage in firing temperature which is as high as 1250° C. or more. In view of this, various attempts have been made to lower the firing temperature, by addition of oxides of Pb, for example.

An example of such dielectric ceramic composition is disclosed in U.S. Pat. No. 3,811,937, wherein a calcined powder of BaO, $TiO_2$ and a rare earth oxide is blended with 8 to 30% by weight of a glass formulation containing CdO, PbO and $Bi_2O_3$. The thus prepared composition is fired at a temperature between about 982° C. and 1150° C. Another example of dielectric ceramic composition as disclosed in JP-A-59-214105 contains BaO, $TiO_2$ and $Nd_2O_3$ as major components, which are mixed with powders of PbO, $Bi_2O_3$, $SiO_2$ and ZnO. This composition is fired at a temperature between 1050° C. and 1150° C. A further example of composition as disclosed in JP-B2-4-16884 contains $BaTiO_3$, $Nd_2O_3$, $TiO_2$ and $Bi_2O_3$ as major components, to which $Pb_3O_4$, $B_2O_3$, $SiO_2$ and ZnO are added in respective suitable amounts. This composition is fired at a temperature between 1000° C. and 1050° C. A still further example of dielectric ceramic composition as disclosed in JP-A-2-44609 contains $BaTiO_3$, $Nd_2O_3$, $TiO_2$, $Bi_2O_3$ and $Pb_3O_4$ as major components, to which $2CaO.3B_2O_3$, $SiO_2$ and ZnO are added. This composition is fired at a temperature between 1000° C. and 1050° C.

The known dielectric ceramic compositions as described above, which can be fired at a relatively low temperature, still has a firing temperature of around 1000° C. or higher, and thus cannot be used with internal conductors formed solely of Ag having a low conductivity resistance, or alloys consisting principally of Ag. In fact, these compositions can be used only with internal conductors formed of Ag-Pd alloys including a relatively high content of Pd having a large conductivity resistance.

While some known techniques are available for lowering the firing temperature of a dielectric ceramic composition down to around 1000° C., there have been unknown such techniques as permitting the firing at a temperature lower than the melting point of Ag, i.e., 962° C., desirably at 950° C. or lower, more desirably at around 900° C.

SUMMARY OF THE INVENTION

The present invention was developed in the light of the prior art situations described above. It is therefore a first object of the invention to provide a method of producing a low temperature firing dielectric ceramic composition which gives a dielectric ceramic having a relatively high specific dielectric constant, a relatively large unloaded Q and a relatively small temperature coefficient of the resonance frequency, and which can be fired or sintered at a temperature of not higher than 962° C. (the melting point of Ag), preferably at around 900° C.

It is a second object of the invention to provide a dielectric resonator obtained by using such a dielectric ceramic composition produced according to the method as described above. It is a third object of the invention to provide a dielectric filter including a plurality of such dielectric resonators. It is a fourth object of the invention to provide a method of producing such a dielectric resonator or dielectric filter.

Having made various analyses to accomplish the first object, the inventors found that addition of $B_2O_3$ to a main ceramic composition composed principally of BaO, $TiO_2$ and $RE_2O_3$ is effective to lower the firing temperature of the dielectric ceramic composition obtained. The inventors also found it desirable to calcine the main ceramic composition at a relatively high temperature, and finely pulverize the calcined mass to a considerably small grain size, so as to provide a dielectric ceramic composition which can be fired at a significantly lowered temperature while assuring excellent dielectric properties.

Namely, the above first object may be accomplished according to a first aspect of the present invention, which provides a method of producing a dielectric ceramic composition comprising the steps of: (a) preparing a main ceramic composition comprising BaO, $TiO_2$ and $RE_2O_3$ (where RE represents at least one rare earth metal) as major components; (b) calcining a mixture of starting materials which give the main ceramic composition, at a temperature of 1050° C. or higher, to provide a calcined mixture; (c) finely pulverizing the calcined mixture to provide a calcined ceramic powder having an average grain size of not larger than 0.8 μm; and (d) adding, as at least a part of a secondary component, a $B_2O_3$ powder or a glass powder containing $B_2O_3$, to the main ceramic composition.

The secondary component may be added to the main ceramic composition in the form of the calcined ceramic powder after the calcining process. Alternatively, the secondary component may be added to the mixture of starting materials which give the main ceramic composition prior to calcining of the starting materials.

Preferably, the main ceramic composition consists of 10-20 mole % of BaO, 60-75 mole % of $TiO_2$, and 10-25 mole % of $RE_2O_3$ (where BaO+$TiO_2$+$RE_2O_3$=100 mole %). In the main ceramic composition, generally, up to 40 mole % of BaO may be substituted by at least one of SrO, CaO and PbO, and up to 30 mole % of $RE_2O_3$ may be substituted by $Bi_2O_3$, while up to 25 mole % of $TiO_2$ may be substituted by at least one of $ZrO_2$ and $SnO_2$.

The above-indicated $B_2O_3$ powder, or glass powder containing $B_2O_3$, may be desirably added to the main ceramic composition, in a proportion of 0.1-7.5 parts by weight of $B_2O_3$ per 100 parts by weight of the main ceramic composition.

The above-indicated second object of the invention may be achieved according to a second aspect of the invention, which provides a dielectric resonator comprising: a dielectric ceramic obtained by firing a dielectric ceramic composition produced according to the method according to the first aspect of the invention; and a conductor pattern which is formed by co-firing with the dielectric ceramic so that the conductor pattern is embedded in the dielectric ceramic. Further, the third object of the invention may be achieved according to a third aspect of the invention, which provides a dielectric filter including a plurality of dielectric resonators as defined above.

The above-indicated fourth object of the invention may be achieved according to a third aspect of the invention, which provides a method of producing a dielectric resonator including a dielectric ceramic and a conductor pattern embedded in the dielectric ceramic, or a dielectric filter including the dielectric resonator, which method is characterized in that a dielectric ceramic composition produced according to the above-described method is co-fired with a conductive layer formed solely of Ag or of an alloy containing Ag as a major component, so as to give the dielectric ceramic and the conductor pattern.

BRIEF DESCRIPTION OF THE DRAWING

FIG. 1 is a graph indicating the results of x-ray powder diffraction analyses on calcined products obtained by calcining a mixture of materials which give a main ceramic composition of the present invention, at different calcining temperatures.

DETAILED DESCRIPTION OF THE PREFERRED EMBODIMENT

The main ceramic composition used for forming the dielectric ceramic composition according to the present invention contains BaO, $TiO_2$ and $RE_2O_3$ as major components. This main ceramic composition, after being calcined, gives a crystal structure having as a main crystal phase a solid solution in the BaO-$RE_2O_3$-4$TiO_2$ system or BaO-$RE_2O_3$-5$TiO_2$ system, and preferably consists of 10-20 mole % of BaO, 60-75 mole % of $TiO_2$ and 10-25 mole % of $RE_2O_3$, (where, BaO+$TiO_2$+$RE_2O_3$=100 mole %).

In the main ceramic composition as described above, up to 40 mole % of BaO may be substituted by at least one of SrO, CaO and PbO, and up to 30 mole % of $RE_2O_3$ may be substituted by $Bi_2O_3$, while up to 25 mole % of $TiO_2$ may be substituted by at least one of $ZrO_2$ and $SnO_2$. If the substituting amount(s) of SrO, CaO, PbO, $Bi_2O_3$, $ZrO_2$ and/or $SnO_2$ exceeds the above upper limit(s), the unloaded Q of the resultant dielectric ceramics is deteriorated. Generally, these substituents, i.e., SrO, CaO, PbO, $Bi_2O_3$, $ZrO_2$ and $SnO_2$, serve to improve the dielectric properties of the dielectric ceramics obtained, e.g., to vary the temperature coefficient of the resonance frequency of resonators, or increase the specific dielectric constant. In particular, suitable metal oxide, such as alumina, iron oxide, manganese oxide, chromium oxide, or zinc oxide may be added to the main ceramic composition as described above, in an attempt to improve the unloaded Q and suitably adjust or control the temperature coefficient of the resonance frequency. In particular, the addition of alumina or manganese oxide to the above ceramic composition is effective to improve the unloaded Q and vary the temperature coefficient of the resonance frequency.

In the present dielectric ceramic composition, RE (rare earth metal) present in $RE_2O_3$ is selected from Nd, Sm, La, Ce, Pr and other rare earth metals. Preferably, RE consists of Nd, or a combination of Nd and Sm and/or La. When Nd is used in combination with Sm and/or La, the temperature coefficient of the resonance frequency can be appropriately controlled while maintaining a sufficiently high specific dielectric constant and large unloaded Q. The amount of Ce or Pr that is introduced into the ceramic composition as RE is determined as converted into trivalent atoms.

$B_2O_3$, which is added as an essential constituent of the secondary component to the main ceramic composition according to the invention, is effective to enable the dielectric ceramic composition to be fired at a relatively low temperature, that is, at 962° C. or lower, desirably at 950° C. or lower, more desirably, at 900° C. or lower. The $B_2O_3$ may be added as a sole constituent element, in other words, a $B_2O_3$ powder may be added to the main ceramic composition. Alternatively, the $B_2O_3$ may be added at a time together with other constituents, such as ZnO, $SiO_2$ and $Bi_2O_3$. In particular, the addition of ZnO is effective to improve the specific dielectric constant while maintaining a sufficiently large unloaded Q, and the addition of $SiO_2$ or $Bi_2O_3$ is effective to improve the sinterability of the dielectric ceramic composition obtained. Upon addition of these constituents, respective powders of ZnO, $SiO_2$ and $Bi_2O_3$ may be added at a time with a $B_2O_3$ powder, or these constituents and $B_2O_3$ may be vitrified and then added to the main ceramic composition.

Since $B_2O_3$ present as a sole constituent element is likely to absorb water and may affect the state of preservation of the ceramic material after the addition thereof, the $B_2O_3$ is desirably contained in a glass which is added to the main ceramic composition, so as to solve the above problem. The water absorption of $B_2O_3$ also results in a poor state of a slurry upon forming a green sheet from the ceramic material, making it difficult to obtain a good tape. This problem is also solved by the vitrification of $B_2O_3$. There are known a lot of glass formulations containing $B_2O_3$, such as a $ZnO-SiO_2-B_2O_3$ glass, $SiO_2-B_2O_3$ glass, and $Bi_2O_3-ZnO-B_2O_3$ glass, any of which can be advantageously employed in practicing the present invention.

The secondary component containing $B_2O_3$ as an essential constituent may be added to the calcined powder of the main ceramic composition, or may be added to a mixture of starting materials which give the main ceramic composition prior to calcining of the starting materials. In this regard, the former method, namely, adding the secondary component to the calcined ceramic powder is preferred in view of the dielectric properties of the dielectric ceramic composition obtained.

The amount of addition of the secondary component in either of the above two methods is determined such that $B_2O_3$ is contained in the dielectric ceramic composition, in an amount of 0.1-7.5 parts by weight per 100 parts by weight of the main ceramic composition. If the amount of addition of the secondary component is so small that the $B_2O_3$ content is smaller than 0.1 part by weight, the $B_2O_3$ added does not yield a satisfactory effect, and the sinterability of the ceramic material obtained is deteriorated. If the $B_2O_3$ content exceeds 7.5 parts by weight, on the other hand, the unloaded Q is deteriorated in the microwave region. Preferably, $B_2O_3$ of the secondary component is contained in an amount of 0.1-6.0 parts by weight per 100 parts by weight of the main ceramic composition.

It is considered difficult to decrease the firing temperature of the obtained dielectric ceramic composition to a sufficiently low value, by merely adding the secondary component containing $B_2O_3$ to the main ceramic composition. According to the present invention, therefore, the mixture of materials which give the main ceramic composition is calcined at a relatively high temperature, i.e., at 1050° C. or higher, and the calcined mixture is finely pulverized to achieve the average grain size of not larger than 0.8 μm, preferably not larger than 0.7 μm.

More specifically, when the calcining temperature for the materials giving the main ceramic composition is 1050° C. or higher, preferably 1100° C. or higher, the obtained calcined mass (main ceramic composition) can be sufficiently crystallized, thereby making the resultant dielectric ceramics satisfactory in its dielectric properties such as the specific dielectric constant and unloaded Q even if the firing temperature thereof is relatively low. If the calcining temperature exceeds 1350° C., however, the calcined mass is likely to excessively harden after the calcining process, causing some problem in handling thereof. In view of this, the calcining temperature is preferably held between 1100° C. and 1300° C.

If the calcined product of the main ceramic composition is not sufficiently crystallized in the above calcining step, the resultant dielectric ceramic is unsatisfactory in its dielectric properties if the calcined product is fired at 962° C. or lower in the following step. In this regard, X-ray powder diffraction analysis may be utilized to determine whether the calcined product is sufficiently crystallized. When Cu is used as an x-ray target, for example, the crystallization may be apparently recognized from separation of peaks where $2\theta$ appears in the vicinity of 30° (CuKα ray) upon the x-ray powder diffraction. It will be understood from FIG. 1 that the peaks are not separated from each other when the calcining temperature is 900° C. or 1000° C., for example, while the peaks are separated from each other, that is, the crystallization is sufficient, when the calcining temperature is 1100° C. or 1200° C. The thus calcined product which is sufficiently crystallized is used according to the present invention. The calcined product may include some secondary phases in addition to such a main crystal as described above. For instance, the calcined product may contain some titanate compounds, such as $BaTi_4O_9$, $Ba_2Ti_9O_{20}$ or $Nd_2Ti_2O_7$, or a crystal of $TiO_2$, for example.

In pulverizing the thus calcined product, the smaller the average grain size of a ceramic powder obtained by the pulverization, the lower the firing temperature of the dielectric ceramic composition obtained, whereby the specific dielectric constant and unloaded Q of the resultant dielectric ceramics can be improved. According to the present invention, therefore, the calcined product is pulverized to achieve the average grain size of not larger than 0.8 μm, preferably not larger than 0.7 μm, making it possible to fire the obtained dielectric ceramic composition at a relatively low temperature of not higher than 962° C. A conventional dielectric ceramic composition, which uses a calcined ceramic powder having the grain size of around 1 μm or larger, is difficult to be fired at 962° C. or lower. As the grain size of the calcined ceramic powder is smaller, the sinterability is improved with a result of reduction in the amount of addition of the secondary component ($B_2O_3$), leading to improvements in the microwave characteristics of the fired dielectric ceramics. If the average grain size of the ceramic powder is smaller than 0.1 μm, however, the formability of the dielectric ceramic composition obtained is deteriorated, making it difficult to form a tape by an ordinary doctor blade technique, for example. Therefore, the average grain size of the ceramic powder is desirably controlled to within a range of about 0.1~0.8 μm. Generally, such a small grain size of the ceramic powder is measured by a laser diffraction and scattering method.

It does not require such fine pulverization as described above to produce the $B_2O_3$ powder, or the glass powder containing $B_2O_3$, which is added as a secondary component to the calcined ceramic powder thus finely pulverized. It is thus possible to use a $B_2O_3$ powder or glass powder having the average grain size of about 2 μm to 4 μm.

When the secondary component, i.e., the $B_2O_3$ powder or glass powder, is added to the materials giving the main ceramic composition prior to the calcining step, the calcined mass including the secondary component is finely pulverized to provide a powder having the average grain size of not larger than 0.8 μm, which powder constitutes the low temperature firing dielectric ceramic composition according to the present invention.

EXAMPLES

To further clarify the concept of the present invention, some examples of the invention will be described. It is to be understood that the invention is not limited to the details of the illustrated examples, but may be embodied with various alterations, modifications and improvements, which may occur to those skilled in the art, without departing from the scope of the invention defined in the appended claims.

EXAMPLE 1

Initially, highly pure barium carbonate, strontium carbonate, calcium carbonate, titanium oxide, neodymium oxide, samarium oxide, lanthanum oxide, bismuth oxide and lead oxide were weighed to give main ceramic compositions of specimens No. 1 through No. 32 having respective values of x, y, z, RE, a, b, c and d as indicated in TABLE 1 and TABLE 2. The thus weighed materials were wet-blended with pure water in a polyethylene pot mill using zirconia balls. The thus obtained mixture was taken out of the pot mill, dried, put into an alumina crucible, and calcined in air for four hours at respective temperatures between 900° C. and 1270° C. Then, the calcined mixture was roughly crushed, thrown back into the polyethylene pot mill with zirconia balls, and to achieve the average grain size of 0.4–1.0 μm as measured by a laser diffraction and scattering method. In this manner, calcined ceramic powders of specimens Nos. 1–32 were obtained.

TABLE 1

| No. | \multicolumn{8}{c}{Main ceramic composition} | Calcining temperature (°C.) | Average grain size (μm) |
|---|---|---|---|---|---|---|---|---|---|---|
| | x | y | z | RE | a | b | c | d | | |
| 1 | 0.125 | 0.695 | 0.180 | 0.80Nd + 0.20Sm | 0 | 0 | 0 | 0 | 1250 | 0.5 |
| 2 | 0.145 | 0.660 | 0.195 | 0.90Nd + 0.10La | 0.15 | " | 0.05 | " | " | " |
| 3 | " | " | " | " | " | " | " | " | " | " |
| 4 | " | " | " | " | " | " | " | " | " | " |
| 5 | 0.150 | " | 0.190 | Nd | 0.05 | 0.05 | 0 | " | " | 0.6 |
| 6 | 0.155 | 0.670 | 0.175 | " | 0 | 0 | " | " | " | 0.5 |
| *7 | " | " | " | 0.90Nd + 0.10Sm | 0.20 | " | " | " | 900 | 0.6 |
| *8 | " | " | " | " | " | " | " | " | 1000 | 0.7 |
| 9 | " | " | " | " | " | " | " | " | 1150 | " |
| 10 | " | 0.675 | 0.170 | Nd | 0.15 | 0.40 | " | " | 1250 | 0.6 |
| *11 | " | " | " | 0.80Nd + 0.20La | 0.18 | 0 | " | " | 1200 | 1.0 |
| 12 | " | " | " | " | " | " | " | " | " | 0.8 |
| 13 | " | " | " | " | " | " | " | " | " | 0.6 |
| 14 | " | " | " | " | " | " | " | " | " | 0.5 |
| 15 | " | " | " | " | " | " | " | " | " | 0.4 |

Main ceramic composition:
$x\{(1 - b - c - d) BaO.bSrO.cCaO.dPbO\}.yTiO_2$ .
$z\{(1 - a) RE_2O_3.aBi_2O_3\}$
*comparative example ramic composition according to the present invention.

TABLE 2

| No. | \multicolumn{8}{c}{Main ceramic composition} | Calcining temperature (°C.) | Average grain size (μm) |
|---|---|---|---|---|---|---|---|---|---|---|
| | x | y | z | RE | a | b | c | d | | |
| 16 | 0.160 | 0.670 | 0.170 | Nd | 0.10 | 0.40 | 0 | 0.10 | 1200 | 0.5 |
| *17 | " | " | " | " | 0.18 | " | " | 0 | 1270 | " |
| 18 | " | " | " | " | " | " | " | " | " | " |
| 19 | " | " | " | " | " | " | " | " | " | " |
| 20 | " | " | " | " | " | " | " | " | " | " |
| 21 | " | " | " | " | " | " | " | " | " | " |
| 22 | " | " | " | " | " | 0 | " | " | 1250 | 0.4 |
| 23 | " | 0.675 | 0.165 | " | 0 | " | 0.05 | " | " | 0.6 |
| 24 | " | " | " | 0.85Nd + 0.15La | 0.10 | 0.10 | 0 | " | " | " |
| 25 | " | " | " | " | " | " | " | " | " | " |
| *26 | " | " | " | Nd | 0.15 | 0 | 0.05 | " | 1000 | 0.5 |
| 27 | " | " | " | " | " | " | " | " | 1100 | " |

TABLE 2-continued

| No. | Main ceramic composition | | | | | | | | Calcining temperature (°C.) | Average grain size (μm) |
|---|---|---|---|---|---|---|---|---|---|---|
| | x | y | z | RE | a | b | c | d | | |
| 28 | " | " | " | " | " | " | " | " | 1150 | " |
| 29 | " | " | " | " | " | " | " | " | 1200 | " |
| 30 | " | " | " | " | " | " | " | " | 1250 | " |
| 31 | 0.180 | 0.700 | 0.120 | " | 0.10 | 0 | 0.10 | " | " | " |
| 32 | " | " | " | " | 0.20 | 0.05 | 0 | " | " | " |

Main ceramic composition:
x {(1 − b − c − d) BaO.bSrO.cCaO.dPbO}.yTiO
z {(1 − a) RE$_2$O$_3$.aBi$_2$O$_3$}
*comparative example Subsequently, each of the calcined ceramic powders of specimens Nos. 1-32 was thrown into a polyethylene pot mill with zirconia balls, and wet-blended in pure water with a B$_2$O$_3$ powder (Nos. 2-4), or a glass containing B$_2$O$_3$ (Nos. 1, 5-16, 18-23, 26-32), or a glass not containing B$_2$O$_3$ (No. 17), as indicated in TABLE 3 and TABLE 4, 5. At the same time, 1% by weight of polyvinyl alcohol (PVA) was added as a binder. The thus obtained mixture was then dried, passed through a sieve having openings of 355 μm, and thus granulated. In specimens No. 24 and 25, a B$_2$O$_3$ powder and powders of ZnO and SiO$_2$ are added as a secondary component to the calcined ceramic powder. In TABLE 3 and TABLE 4, the amount of addition of the secondary component is expressed by the respective amounts of B$_2$O$_3$ and other constituents even when the secondary component takes the form of glass.

The thus prepared granules of each specimen were formed with a press at a surface pressure of 1 ton/cm$^2$, into a circular disc having a diameter of 20 mm and a thickness of 15 mm. The circular discs corresponding to the specimens Nos. 1-32 were fired in air for two hours at 900° C., to thereby provide respective samples of dielectric ceramics. These samples were ground into circular discs each having a diameter of 16 mm and a thickness of 8 mm, and the dielectric properties of each sample were measured. More specifically, the specific dielectric constant (εr) and unloaded Q were measured according to Hakki & Coleman method, while the temperature coefficient (τf) of the resonance frequency was measured over a range from -25° C. to 75° C. The measurement was effected at a frequency of 2-4 GHz. The results of the measurement are also indicated in TABLE 3 and TABLE 4.

TABLE 3

| No. | B$_2$O$_3$ (parts by weight) | Other constituents (parts by weight) | Dielectric properties | | |
|---|---|---|---|---|---|
| | | | εr | Q (3GHz) | τf (ppm/°C.) |
| 1 | 1.2 | ZnO 2.5 SiO$_2$ 0.3 | 50 | 1300 | 12 |
| 2 | 1.0 | | 74 | 960 | −2 |
| 3 | 2.0 | | 78 | 790 | 1 |
| 4 | 4.0 | | 68 | 510 | −3 |
| 5 | 2.0 | ZnO 0.7 Bi$_2$O$_3$ 4.3 | 60 | 550 | 8 |
| 6 | 1.7 | ZnO 3.8 SiO$_2$ 0.5 | 65 | 1220 | 15 |
| *7 | 0.6 | ZnO 1.6 SiO$_2$ 0.3 | 47 | 610 | 2 |
| *8 | " | ZnO 1.6 SiO$_2$ 0.3 | 47 | 620 | 2 |
| 9 | " | ZnO 1.6 SiO$_2$ 0.3 | 61 | 500 | 1 |
| 10 | " | ZnO 1.6 SiO$_2$ 0.3 | 64 | 1030 | 0 |
| *11 | " | ZnO 1.3 SiO$_2$ 0.2 | 50 | 450 | 5 |
| 12 | " | ZnO 1.3 SiO$_2$ 0.2 | 63 | 670 | 4 |
| 13 | " | ZnO 1.3 SiO$_2$ 0.2 | 77 | 930 | 1 |
| 14 | " | ZnO 1.3 SiO$_2$ 0.2 | 80 | 960 | 0 |
| 15 | " | ZnO 1.3 SiO$_2$ 0.2 | 84 | 950 | 0 |

*comparative example

TABLE 4

| No. | B$_2$O$_3$ (parts by weight) | Other constituents (parts by weight) | Dielectric properties | | |
|---|---|---|---|---|---|
| | | | εr | Q (3GHz) | τf (ppm/°C.) |
| 16 | 0.6 | ZnO 1.3 SiO$_2$ 0.2 | 80 | 1000 | −6 |
| *17 | 0.0 | SiO$_2$ 0.2 BaO 0.5 | 25 | 340 | — |
| 18 | 0.1 | PbO 1.0 ZnO 0.3 | 54 | 590 | 3 |
| 19 | 0.2 | PbO 1.2 SiO$_2$ 0.6 | 55 | 530 | 2 |
| 20 | 0.3 | ZnO 0.8 PbO 0.8 | 69 | 740 | −1 |
| 21 | 0.3 | PbO 1.4 SiO$_2$ 1.2 | 62 | 600 | 1 |
| 22 | 0.6 | SiO$_2$ 2.4 | 70 | 910 | −1 |
| 23 | 1.2 | ZnO 2.5 SiO$_2$ 0.3 | 63 | 1180 | 18 |
| 24 | 2.0 | ZnO 0.25 SiO$_2$ 1.0 | 62 | 890 | 6 |
| 25 | " | ZnO 0.5 SiO$_2$ 1.0 | 65 | 930 | 3 |
| *26 | 0.6 | ZnO 1.3 SiO$_2$ 0.2 | 46 | 800 | 7 |
| 27 | " | ZnO 1.3 SiO$_2$ 0.2 | 77 | 1040 | 5 |
| 28 | " | ZnO 1.3 SiO$_2$ 0.2 | 78 | 1100 | −2 |
| 29 | " | ZnO 1.3 SiO$_2$ 0.2 | 78 | 1120 | −8 |
| 30 | " | ZnO 1.3 SiO$_2$ 0.2 | 78 | 1130 | −8 |
| 31 | 1.1 | ZnO 0.4 Bi$_2$O$_3$ 2.5 | 73 | 1120 | 15 |
| 32 | 0.6 | SiO$_2$ 1.4 | 74 | 620 | 6 |

*comparative example

As indicated in specimens Nos. 24 and 25 of TABLE 4, the B$_2$O$_3$ powder may be added together with powders of ZnO and SiO$_2$. It is recognized that the simultaneous addition of B$_2$O$_3$ and ZnO results in an increase in the specific dielectric constant and that the simultaneous addition of B$_2$O$_3$ and SiO$_2$ results in an increase in the unloaded Q.

It is also recognized from the results of the above measurements on specimens Nos. 11-15 wherein the calcining temperature was 1200° C. and a ZnO-B$_2$O$_3$-SiO$_2$ glass was added to each of the calcined ceramic powders having respective average grain sizes that the specific dielectric constant and unloaded Q are considerably improved when the average grain size is 0.8 μm or lower, as compared with when the same size is 1.0 μm.

It is further recognized from the results of the above measurements on specimens Nos. 1, 5-23, 26-32 wherein the main ceramic compositions which were calcined at respective temperatures and finely pulverized were blended with respective glass compositions that the sinterability is extremely deteriorated when the glass composition does not contain B$_2$O$_3$ as in the comparative example of No. 17, and that the inclusion of B$_2$O$_3$ in the glass composition yields excellent effects on the resultant dielectric ceramics.

EXAMPLE 2

Initially, highly pure barium carbonate, strontium oxide, calcium oxide, titanium oxide, neodymium oxide, samarium oxide, lanthanum oxide, bismuth oxide and lead oxide were weighed to give main ceramic compositions of specimens No. 33 through No. 50 having respective values of x, y, z, RE, a, b, c and d as indicated in TABLE 5. On the other hand, a secondary component in the form of a $B_2O_3$ powder (Nos. 43-46), or powders of $B_2O_3$, ZnO and $SiO_2$ (Nos. 33, 38, 39, 47-50) or a $ZnO-B_2O_3-SiO_2$ glass (Nos. 34-37, 40-42) was weighed such that each constituent element is contained in the amount as indicated in TABLE 6 per 100 parts by weight of the main ceramic composition. The main ceramic composition and the secondary component were wet-blended together with pure water in a polyethylene pot mill using zirconia balls. The thus obtained mixture was taken out of the pot mill, dried, put into an alumina crucible, and calcined in air for four hours at respective temperatures between 1000° C. and 1250° C. Then, the calcined mixture was roughly crushed, thrown back into the polyethylene pot mill with zirconia balls, and pulverized to achieve the average grain size of 0.4-1.0 μm as measured by a laser diffraction and scattering method. In this manner, calcined ceramic powders of specimens Nos. 33-50 were obtained.

Then, each of the calcined ceramic powders of specimens Nos. 33-50 was wet-blended with pure water, with the addition of 1% by weight of polyvinyl alcohol (PVA) as a binder. The thus obtained mixture was dried, passed through a sieve having openings of 355 μm, and thus granulated.

The thus prepared granules of each specimen were formed with a press at a surface pressure of 1 ton/cm², into a circular disc having a diameter of 20 mm and a thickness of 15 mm. The circular discs corresponding to the specimens Nos. 33-50 were fired in air for two hours at 900° C., to thereby provide respective samples of dielectric ceramics. These samples were ground into circular discs each having a diameter of 16 mm and a thickness of 8 mm, and the dielectric properties of each sample were measured in the same manner as EXAMPLE 1. The results of the measurement are indicated in TABLE 7.

TABLE 5

| No | \multicolumn{8}{c|}{Main ceramic composition} |
|---|---|---|---|---|---|---|---|---|
|    | x | y | z | RE | a | b | c | d |
| 33 | 0.145 | 0.665 | 0.190 | Nd | 0.10 | 0 | 0.05 | 0 |
| *34 | " | 0.675 | 0.180 | 0.88Nd + 0.12La | 0.15 | " | 0 | " |
| 35 | " | " | " | " | " | " | " | " |
| 36 | " | " | " | " | " | " | " | " |
| 37 | " | " | " | " | " | " | " | " |
| 38 | 0.150 | 0.660 | 0.190 | Nd | 0 | 0.20 | " | " |
| 39 | 0.155 | 0.675 | 0.170 | " | 0.18 | 0.10 | " | " |
| *40 | " | 0.670 | 0.175 | 0.90Nd + 0.10Sm | 0.20 | 0 | " | " |
| 41 | " | " | " | " | " | " | " | " |
| 42 | " | " | " | " | " | " | " | " |
| 43 | 0.160 | " | 0.170 | 0.80Nd + 0.20Sm | 0.10 | 0.05 | " | " |
| 44 | " | " | " | " | " | " | " | " |
| 45 | " | " | " | " | " | " | " | " |
| 46 | " | " | " | " | " | " | " | " |
| 47 | " | 0.675 | 0.165 | 0.90Nd + 0.10Sm | 0 | 0 | " | 0.10 |
| 48 | " | " | " | " | " | " | " | 0 |
| 49 | 0.165 | 0.670 | " | Nd | " | " | 0.15 | " |
| 50 | 0.180 | 0.700 | 0.120 | " | " | " | 0 | " |

Main ceramic composition:
x {(1 − b − c − d) BaO.bSrO.cCaO.dPbO}.yTiO₂.
z {(1 − a) RE₂O₃.aBi₂O₃}
*comparative example

TABLE 6

| No. | $B_2O_3$ (parts by weight) | Other constituents (parts by weight) |
|---|---|---|
| 33 | 0.2 | $SiO_2$ 0.6 |
| *34 | 0.6 | ZnO 1.6 $SiO_2$ 0.3 |
| 35 | " | " |
| 36 | " | " |
| 37 | " | " |
| 38 | 0.3 | ZnO 0.7 $SiO_2$ 0.1 |
| 39 | 0.1 | ZnO 0.3 |
| *40 | 0.6 | ZnO 1.3 $SiO_2$ 0.2 |
| 41 | " | " |
| 42 | " | " |
| 43 | 0.1 | |
| 44 | 1.0 | |
| 45 | 2.0 | |
| 46 | 5.0 | |
| 47 | 0.3 | ZnO 0.7 $SiO_2$ 0.1 |
| 48 | 0.1 | ZnO 0.4 $SiO_2$ 0.1 |
| 49 | 2.0 | ZnO 0.7 |
| 50 | 0.3 | ZnO 0.7 $SiO_2$ 0.1 |

*comparative example

TABLE 7

| No. | Calcining temperature (°C.) | Average grain size (μm) | $\epsilon_r$ | Q (3GHz) | τf (ppm/°C.) |
|---|---|---|---|---|---|
| 33 | 1150 | 0.5 | 53 | 680 | 5 |
| *34 | " | 1.0 | 43 | 510 | 5 |
| 35 | " | 0.8 | 58 | 670 | 2 |
| 36 | " | 0.5 | 71 | 880 | 0 |
| 37 | " | 0.4 | 73 | 910 | 0 |
| 38 | 1200 | 0.6 | 60 | 570 | 8 |
| 39 | 1150 | 0.5 | 55 | 580 | 3 |
| *40 | 1000 | " | 45 | 500 | −1 |
| 41 | 1100 | " | 66 | 780 | −2 |
| 42 | 1150 | " | 72 | 810 | −4 |
| 43 | 1100 | " | 54 | 550 | 6 |
| 44 | " | " | 68 | 750 | 3 |
| 45 | " | " | 70 | 710 | 2 |
| 46 | " | " | 69 | 580 | 2 |
| 47 | 1200 | " | 70 | 720 | −2 |
| 48 | 1250 | 0.4 | 54 | 680 | 15 |
| 49 | 1150 | 0.5 | 61 | 720 | 8 |
| 50 | 1200 | " | 57 | 690 | 12 |

*comparative example

It will be understood from the results of the measurements on specimens Nos. 34-37 wherein the calcining temperature is 1150° C. as indicated in TABLE 7 that the specific dielectric constant and unloaded Q are greatly improved when the average grain size of the calcined ceramic powder is 0.8 μm or lower (No. 35-37), as compared with when the same size is 1.0 μmm (No. 34). It will also be understood from the measurement results on specimens Nos. 40-42 showing the effect of the calcining temperature that the specific dielectric constant and unloaded Q are greatly improved when the calcining temperature is 1100° C. or higher (Nos. 41, 42), as compared with when the same temperature is 1000° C. (No. 40).

EXAMPLE 3

The calcined ceramic powder and $ZnO-B_2O_3-SiO_2$ glass powder used for specimen No. 16 of TABLE 2 and TABLE 4 were wet-blended in an alumina pot mill using zirconia balls, with polyvinyl butyral (8 parts by weight), and suitable amounts of a plasticizer and a peptizing agent, within a mixed solution of toluene and isopropyl alcohol.

The thus prepared mixture was degassed, and formed by a doctor blade technique into green tapes each having a thickness of 220 $\mu$m. Then, a conductor pattern for a 900 MHz 3-resonator interdigital bandpass filter was printed on one of the thus formed green tapes, by using an Ag paste suited for printing. Thereafter, 12 sheets of the green tapes, including as an intermediate sheet the above-indicated one tape on which the conductor pattern was printed, were laminated at 100 kgf/cm² at 100° C. The laminated green tapes were cut into segments, and then fired in air for two hours at 900° C., to thereby provide stripline type filters.

Upon measurement of the filter characteristics by means of a network analyzer, the thus obtained stripline type filters exhibited a center frequency of 930 MHz, and an insertion loss of 1.5 dB.

According to the present method of producing the dielectric ceramic composition, a $B_2O_3$ powder or a glass powder containing $B_2O_3$ is added as a secondary component to the main ceramic composition consisting principally of BaO, $TiO_2$ and $RE_2O_3$, while the mixture of materials giving the main ceramic composition is calcined at 1050° C. or higher and the calcined mixture is finely pulverized to achieve the average grain size of 0.8 $\mu$m or smaller. The thus prepared dielectric ceramic composition may be fired or sintered at 962° C. or lower, preferably at 950° C. or lower, particularly at around 900° C. Accordingly, the dielectric ceramics obtained from the dielectric ceramic composition are advantageously used for producing a dielectric filter, such as a stripline type filter, which incorporates internal conductive layers formed solely of Ag having a relatively low conductivity resistance, or of alloys containing Ag as a major component. Further, the dielectric ceramics exhibit a sufficiently high specific dielectric constant, a sufficiently large unloaded Q and a significantly reduced temperature coefficient of the resonance frequency.

What is claimed is:

1. A method of producing a dielectric ceramic composition, comprising the steps of:
    preparing a main ceramic composition comprising BaO, $TiO_2$, and $Re_2O_3$ as major components, Re representing at least one rare earth metal, wherein a mixture of starting materials which give said main ceramic composition is calcined at a temperature not lower than 1050° C.;
    finely pulverizing said calcined mixture to provide a calcined ceramic powder having an average grain size of not larger than 0.8 $\mu$m; and
    adding a secondary component comprising $B_2O_3$ powder or a glass powder containing $B_2O_3$ to said calcined ceramic powder or said mixture of starting materials prior to calcining, wherein $B_2O_3$ is contained in the dielectric ceramic composition in an amount of 0.1-7.5 parts by weight per 100 parts by weight of the main ceramic composition.

2. A method according to claim 1, wherein said secondary component is added to the calcined ceramic powder.

3. A method according to claim 1, wherein said secondary component is added to said mixture of starting materials prior to calcining said mixture of starting materials.

4. A method according to claim 1 wherein said main ceramic composition consists of 10-20 mole % of BaO, 60-75 mole % of $TiO_2$, and 10-25 mole % of $Re_2O_3$, wherein $BaO + TiO_2 + Re_2O_3 = 100$ mole %.

5. A method according to claim 1, wherein said main ceramic composition further comprises at least one of SrO, CaO and PbO as a substitute of up to 40 mole % of BaO.

6. A method according to claim 1, wherein said main ceramic composition further comprises $Bi_2O_3$ as a substitute of up to 30 mole % of $Re_2O_3$.

7. A method according to claim 1, wherein said main ceramic composition further comprises at least one of $ZrO_2$ and $SnO_2$ as a substitute of up to 25 mole % of $TiO_2$.

8. A method according to claim 1, wherein said secondary component is added in a proportion of 0.1-6.0 parts by weight of $B_2O_3$ per 100 parts by weight of said main ceramic composition.

9. A method according to claim 1, wherein said at least one rare earth metal consists of at least one material from the group consisting of Nd, Sm, La, Ce and Pr.

10. A method according to claim 9, wherein said at least one rare earth metal consists of Nd.

11. A method according to claim 9, wherein said at least one rare earth metal consists of one of a combination of Nd and Sm, and of Nd, Sm and La.

12. A method according to claim 1, wherein said mixture of starting materials is calcined at a temperature of not lower than 1100° C.

13. A method according to claim 12, wherein said mixture of starting materials is calcined at a temperature between 1100° C. and 1300° C.

14. A method according to claim 1, wherein said calcined ceramic powder has an average grain size of not larger than 0.7 $\mu$m.

15. A method according to claim 1, wherein said calcined ceramic powder has an average grain size of not smaller than 0.1 $\mu$m.

16. A method of producing a dielectric ceramic body, comprising the steps of:
    preparing a main ceramic composition comprising BaO, $TiO_2$, and $Re_2O_3$ as major components, Re representing at least one rare earth metal, wherein a mixture of starting materials which give said main ceramic composition is calcined at a temperature not lower than 1050° C.;
    finely pulverizing said calcined mixture to provide a calcined ceramic powder having an average grain size of not larger than 0.8 $\mu$m;
    adding a secondary component comprising $B_2O_3$ or a glass containing $B_2O_3$ to said calcined ceramic powder or said mixture of starting materials prior to calcining so as to form a dielectric ceramic powder, wherein $B_2O_3$ is contained in the dielectric ceramic composition in an amount of 0.1-7.5 parts by weight per 100 parts by weight of said main ceramic composition; and sintering said dielectric ceramic powder.

17. A method according to claim 16, wherein said dielectric ceramic powder is sintered at a temperature not higher than 962° C.

18. A dielectric ceramic body produced according to the method as defined in claim 16.

19. A method according to claim 6, wherein said main ceramic composition further comprises at least one of SrO, CaO and PbO as a substitute of up to 40 mole % of BaO.

20. A method according to claim 6, wherein said main ceramic composition further comprises at least one of $ZrO_2$ and $SnO_2$ as a substitute of up to 25 mole % of $TiO_2$.

21. A method according to claim 19, wherein said main ceramic composition further comprises at least one of $ZrO_2$ and $SnO_2$ as a substitute of up to 25 mole % of $TiO_2$.

* * * * *